United States Patent
Kim et al.

(10) Patent No.: US 8,207,750 B2
(45) Date of Patent: Jun. 26, 2012

(54) CIRCUIT FOR CONTINUOUSLY MEASURING DISCONTINUOUS METAL INSULATOR TRANSITION OF MIT ELEMENT AND MIT SENSOR USING THE SAME

(75) Inventors: Hyun-Tak Kim, Daejeon (KR); Bong-Jun Kim, Daejeon (KR); Yong-Wook Lee, Daejeon (KR); Sun-Jin Yun, Daejeon (KR); Sang-Kuk Choi, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 626 days.

(21) Appl. No.: 12/376,668

(22) PCT Filed: Jul. 5, 2007

(86) PCT No.: PCT/KR2007/003268
§ 371 (c)(1),
(2), (4) Date: Feb. 6, 2009

(87) PCT Pub. No.: WO2008/018691
PCT Pub. Date: Feb. 14, 2008

(65) Prior Publication Data
US 2010/0182034 A1   Jul. 22, 2010

(30) Foreign Application Priority Data

Aug. 7, 2006 (KR) .................. 10-2006-0074310
Dec. 15, 2006 (KR) .................. 10-2006-0128928

(51) Int. Cl.
*G01R 31/02* (2006.01)

(52) U.S. Cl. .................................. 324/762.01
(58) Field of Classification Search .......... 324/762.01
See application file for complete search history.

(56) References Cited

U.S. PATENT DOCUMENTS

| | | | | |
|---|---|---|---|---|
| 5,677,634 A | * | 10/1997 | Cooke et al. | 324/548 |
| 5,828,222 A | * | 10/1998 | Chen | 324/678 |
| 5,859,532 A | * | 1/1999 | Keller | 324/232 |
| 6,420,877 B1 | | 7/2002 | Replogle | |
| 6,693,439 B1 | * | 2/2004 | Liu et al. | 324/613 |
| 6,703,841 B2 | | 3/2004 | Scilla | |
| 6,982,555 B2 | * | 1/2006 | Yamashita et al. | 324/519 |

FOREIGN PATENT DOCUMENTS

| | | |
|---|---|---|
| JP | 07-272652 | 10/1995 |
| JP | 2002-070869 | 3/2002 |
| JP | 2006-032898 A | 2/2006 |
| KR | 10-0223972 | 7/1999 |

(Continued)

*Primary Examiner* — Arleen M Vazquez
(74) *Attorney, Agent, or Firm* — Rabin & Berdo, P.C.

(57) ABSTRACT

Provided are a circuit for continuously measuring a discontinuous metal-insulator transition (MIT) of an MIT element and an MIT sensor using the circuit. The circuit comprises a to-be-measured object unit including the MIT element having a discontinuous MIT occurring at the transition voltage thereof, a power supply unit applying a predetermined pulse current or voltage signal to the to-be-measured object unit, a measurement unit measuring the discontinuous MIT of the MIT element, and a microprocessor controlling the power supply unit and the measurement unit. The discontinuous MIT measurement circuit continuously measures the discontinuous MIT of the MIT element, and thus it can be used as a sensor for sensing a variation in an external factor.

24 Claims, 11 Drawing Sheets

| | FOREIGN PATENT DOCUMENTS | |
|---|---|---|
| KR | 20-2000-0010162 | 6/2000 |
| KR | 10-2001-0040144 | 5/2001 |
| KR | 10-2001-0057741 | 7/2001 |
| KR | 10-2005-0001798 | 1/2005 |
| KR | 10-2006-0006195 | 1/2006 |
| KR | 10-2006-0025113 | 3/2006 |

* cited by examiner

CIRCUIT FOR CONTINUOUSLY MEASURING DISCONTINUOUS METAL INSULATOR TRANSITION OF MIT ELEMENT AND MIT SENSOR USING THE SAME

TECHNICAL FIELD

The present invention relates to a metal-insulator transition (MIT) device, and more particularly, to an MIT element application circuit and an MIT sensor using the same.

BACKGROUND ART

Recently, new MIT application techniques have been developed. It is generally known that a discontinuous jump occurs at 68° C. in vanadium oxide ($V_2O_5$), and thus a ceramic material of vanadium oxide generating a discontinuous MIT can be used as a sensor for sensing a specific temperature. However, a new fact that a discontinuous MIT can be controlled was discovered and disclosed in the paper, 'New J. Phys. 6 (2004) 52 (www.njp.org)'.

Sensors are generally classified into a physical quantity sensor sensing light, magnetism, pressure and so on and a chemical quantity sensor sensing a gas, timidity and so on. As technology is being continuously developed, a variety of accurate sensors are being developed.

Among sensors are temperature sensors that use a thermistor or a bimetal. The temperature range that can be sensed by the temperature sensors is limited to a specific temperature or may be excessively wide. Sensors sensing the intensity of light include a Charge Coupled Device (CCD) image sensor and a Complementary Metal Oxide Semiconductor (CMOS) image sensor used for digital cameras or camcorders. These sensors are expensive and capable of sensing only light.

In an MIT element, an abrupt transition from an insulator to a metal occurs at a specific voltage (referred to as 'transition voltage' hereinafter) or at a specific temperature (referred to as 'transition temperature' hereinafter). The transition voltage or the transition temperature can be controlled, as described above. MIT phenomenon can be explained, using a voltage-current curve, as a discontinuous jump of current at the transition voltage or the transition temperature. The transition voltage or the transition temperature of the MIT element can vary according to an external factor such as light, temperature, pressure or a gas. Thus, a variation in an external factor can be sensed by continuously measuring a discontinuous MIT jump of the MIT element. However, an electronic circuit capable of measuring the discontinuous MIT of the MIT element has not yet been developed.

DISCLOSURE OF INVENTION

Technical Problem

The present invention provides a circuit capable of continuously measuring a discontinuous MIT of an MIT element and an MIT sensor using the same.

Technical Solution

According to an aspect of the present invention, there is provided a circuit for measuring a discontinuous MIT of an MIT element comprising: a to-be-measured object unit including the MIT element in which a discontinuous MIT occurs at the transition voltage thereof; a power supply unit applying a predetermined pulse current or voltage signal to the to-be-measured object unit; a measurement unit measuring the discontinuous MIT of the MIT element; and a controller controlling the power supply unit and the measurement unit.

The to-be-measured object unit may comprise a protection resistor connected in series with the MIT element, and the power supply unit may comprise a DAC (digital-to-analog converter) generating the pulse current or voltage signal and an operational amplifier amplifying the output signal of the DAC. The measurement unit may comprise a comparator and an edge triggered flip-flop or a sample holder storing the output signal of the comparator and transmitting the stored signal to a microprocessor of the controller. A resistance component in the MIT element instead of an external resistor can be used as a protection resistor.

A first input terminal of the comparator may be connected between the MIT element and the protection resistor and a second input terminal thereof may receive a reference voltage corresponding to the transition voltage of the MIT element. The reference voltage may be controlled through a variable resistor, and the pulse current or voltage signal generated by the power supply unit may be applied to the MIT element. The comparator may output a Low signal when the voltage of the first input terminal is lower than the voltage of the second input terminal and output a High signal when the voltage of the first input terminal is equal to or higher than the voltage of the second input terminal, and the edge triggered flip-flop or the sample holder may store the output signal of the comparator and transmit the output signal to the micro-processor.

The microprocessor may control the output signal of the DAC through a data bus. The reference voltage may be applied by a microprocessor of the controller.

The to-be-measured object unit may comprise a protection resistor connected in series with the MIT element, and the power supply unit may comprise a DAC generating the pulse current or voltage signal and an operational amplifier amplifying the output signal of the DAC. The measurement unit may comprise a sample holder and an ADC (analog-to-digital converter) converting the output signal of the sample holder into a digital signal.

The pulse current or voltage signal may be applied to the MIT element at a high frequency. The sample holder may store a variation in the voltage or current of the MIT element for a predetermined period of time. The ADC may receive the output signal of the sample holder, convert the output signal into a digital signal and transmit the digital signal to a microprocessor of the controller.

A microprocessor of the controller may output a control signal to the DAC and receive the signal corresponding to the voltage or current variation of the MIT element from the ADC through a data bus. Signal transmission through the data bus may be controlled by a chip selector.

The to-be-measured object unit may comprise a protection resistor connected in series with the MIT element, and the power supply unit may comprise a transistor controlled by a pulse current or voltage signal and an input power supply applying a fixed voltage to the to-be-measured object unit. The measurement unit may comprise a comparator and an edge triggered flip-flop or a sample holder storing the output signal of the comparator and transmitting the stored signal to a microprocessor of the controller.

A first input terminal of the comparator may be connected between the MIT element and the protection resistor and a second input terminal thereof may receive a reference voltage corresponding to the transition voltage of the MIT element. The reference voltage may be controlled by a variable resistor. The comparator may output a Low signal when the voltage of the first input terminal is lower than the voltage of the second input terminal and output a High signal when the voltage of the first input terminal is equal to or higher than the voltage of the second input terminal. The edge triggered flip-flop or the sample holder may store the output signal of the comparator and transmit the output signal to a microprocessor of the controller.

The pulse current or voltage signal may be generated by the microprocessor and applied to the transistor or generated by an additional pulse generating oscillator and applied to the transistor.

The transistor may be a bipolar transistor or a MOS (Metal Oxide Semiconductor) transistor. When the transistor is a bipolar transistor, the pulse current or voltage signal is applied to a base of the bipolar transistor, and the to-be-measured object unit may be connected to a collector or emitter of the bipolar transistor. When the transistor is a MOS transistor, the pulse current or voltage signal is applied to a gate of the MOS transistor, and the to-be-measured object unit may be connected to a drain or source of the MOS transistor.

The to-be-measured object unit may comprise a protection resistor connected in series with the MIT element, and the power supply unit may comprise a transistor controlled by a pulse current or voltage signal and an input power supply applying a fixed voltage to the to-be-measured object unit. The measurement unit may comprise a sample holder and an ADC converting the output signal of the sample holder into a digital signal.

A high-frequency pulse voltage or current signal may be applied to the MIT element. The sample holder may store a variation in the voltage or current of the MIT element for a predetemilned period of time. The ADC may receive the output signal of the sample holder, convert the output signal into a digital signal and transmit the digital signal to a microprocessor of the controller.

The to-be-measured object unit may comprise at least two MIT elements and a multiplexer selecting the MIT elements, and the microprocessor may apply a select signal to the multiplexer to select at least one of the MIT elements so as to measure a discontinuous MIT of the at least one selected MIT element.

According to another aspect of the present invention, there is provided an MIT sensor manufactured using the discontinuous MIT measurement circuit.

The MIT sensor may correspond to one of a temperature sensor, an infrared ray sensor, an image sensor, a pressure sensor, an electromagnetic sensor, a particle detector, a gas concentration sensor and a switch. The to-be-measured object unit may comprise a plurality of MIT elements that are connected in series, parallel or series and parallel, or arranged in an array or matrix.

The MIT elements may be arranged in an array or matrix and have a transition voltage varying according to electromagnetic waves including infrared rays, and the discontinuous MIT measurement circuit detects the transition voltage so as to measure the intensity of the electromagnetic waves.

The MIT sensor may be an image sensor.

The discontinuous MIT measurement circuit according to the present invention can continuously measure a discontinuous MIT of an MIT element. Furthermore, since the transition voltage or the transition temperature of the MIT element varies according to an external factor such as temperature, pressure or gas concentration, the discontinuous MIT measurement circuit can be used as a sensor for sensing a variation in the external factor by continuously measuring the discontinuous MIT of the MIT element. Accordingly, an MIT sensor manufactured using the discontinuous MIT measurement circuit according to the present invention can sense a physical or chemical variation such as a variation in light, pressure, temperature or gas concentration.

Advantageous Effects

The discontinuous MIT measurement circuit according to the present invention can continuously measure a discontinuous MIT of an MIT element. Furthermore, since the transition voltage or the transition temperature of the MIT element varies with an external factor such as temperature, pressure or gas concentration, the discontinuous MIT measurement circuit can be used as a sensor for sensing a variation in the external factor by continuously measuring the discontinuous MIT of the MIT element. Moreover, a plurality of MIT elements are arranged in an array or matrix and light intensity is sensed through the MIT measurement circuit to construct an image sensor used in a digital camera.

DESCRIPTION OF DRAWINGS

The above and other features and advantages of the present invention will become more apparent by describing in detail exemplary embodiments thereof with reference to the attached drawings in which.

BEST MODE

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Throughout the drawings, like reference numerals refer to like elements.

A metal-insulator transition (MIT) element includes a transition thin film and at least two electrode thin films. The MIT element can have a vertical structure or a planar structure according to the positions of the transition thin film and the electrode thin films.

Figure 1A:
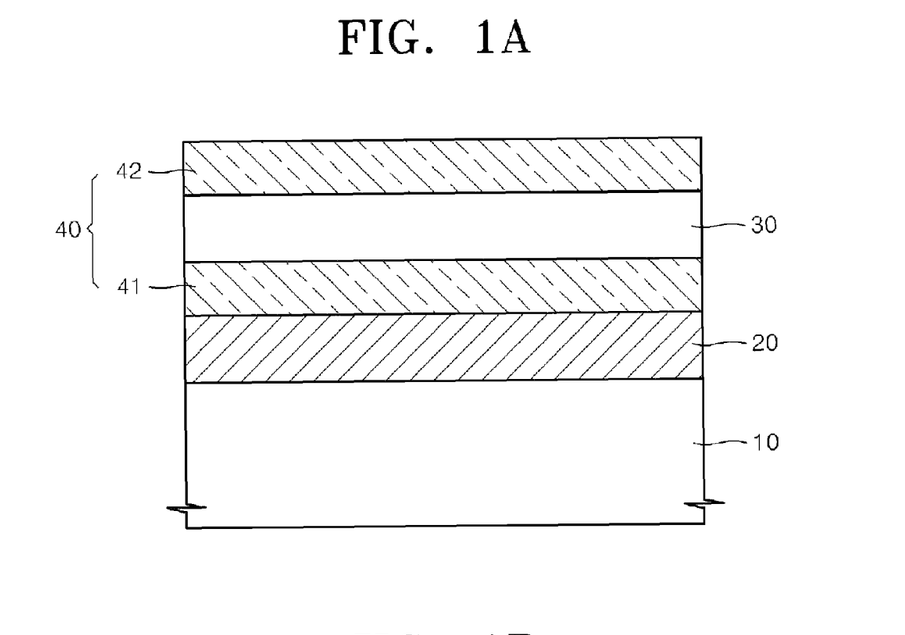
FIG. 1A is a cross-sectional view of a metal-insulator transition (MIT) element having a vertical structure.

FIG. 1A is a cross-sectional view of an MIT element having the vertical structure. Referring to FIG. 1A, the MIT element having the vertical structure includes a substrate 10, a buffer layer 20 formed on the substrate 10, a first electrode thin film 41, a transition thin film 30 and a second electrode thin film 42, which are sequentially formed on the buffer layer 20.

The buffer layer 20 reduces lattice mismatch between the substrate 10 and the first electrode thin film 41. When lattice mismatch between the substrate 10 and the first electrode thin film is insignificant, the first electrode thin film 41 can be directly formed on the substrate 10 without forming the buffer layer 20 between them. The buffer layer 20 can be formed of $SiO_2$ or $Si_3N_4$.

The transition thin film 30 can be formed of an inorganic compound semiconductor or an insulator to which low-density holes are added, such as oxygen, carbon, semi-conductor elements (III-V group and II-VI group), transition metal elements, rare earth elements and lanthanide elements, an organic semiconductor or an insulator to which low-density holes are added, a semiconductor to which low-density holes are added, or an oxide semiconductor or an insulator to which low-density holes are added. The density of the added holes is approximately $3 \times 10^{16}$ cm$^{-3}$. Furthermore, the transition thin film 30 can be formed of an n-type semiconductor having a very large resistance or an insulator.

The electrode thin film 40 can be formed of at least one material selected from the group consisting of W, Mo, W/Au, Mo/Au, Cr/Au, Ti/W, Ti/Al/N, Ni/Cr, Al/Au, Pr, Cr/Mo/Au, $YBa_2Cu_3O_{7-d}$, Ni/Au, Ni/Mo, Ni/Mo/Au, Ni/Mo/Ag, Ni/Mo/Al, Ni/W, Ni/W/Au, Ni/W/Ag and M/W/Al. The electrode thin film 40 can be formed by using at least one of sputtering, evaporation and E-beam deposition.

The substrate 10 can be formed of at least one material selected from the group consisting of Si, $SiO_2$, GaAs, $Al_2O_3$, plastics, glass, $V_2O_5$, $PrBa_2Cu_3O_7$, $YBa_2Cu_3O_7$, MgO, $SrTiO_3$, Nb-doped $SrTiO_3$ and SOI (Silicon on Insulator).

The electrical characteristic of the MIT element abruptly varies with voltage or temperature. That is, the MIT element has the property of insulator at a voltage lower than the transition voltage or a temperature lower than the transition temperature. At a voltage equal to or higher than the transition voltage or a temperature equal to or higher than the transition temperature, a discontinuous MIT occurs in the MIT element, and thus the MIT element has the property of metal.

Figure 1B:
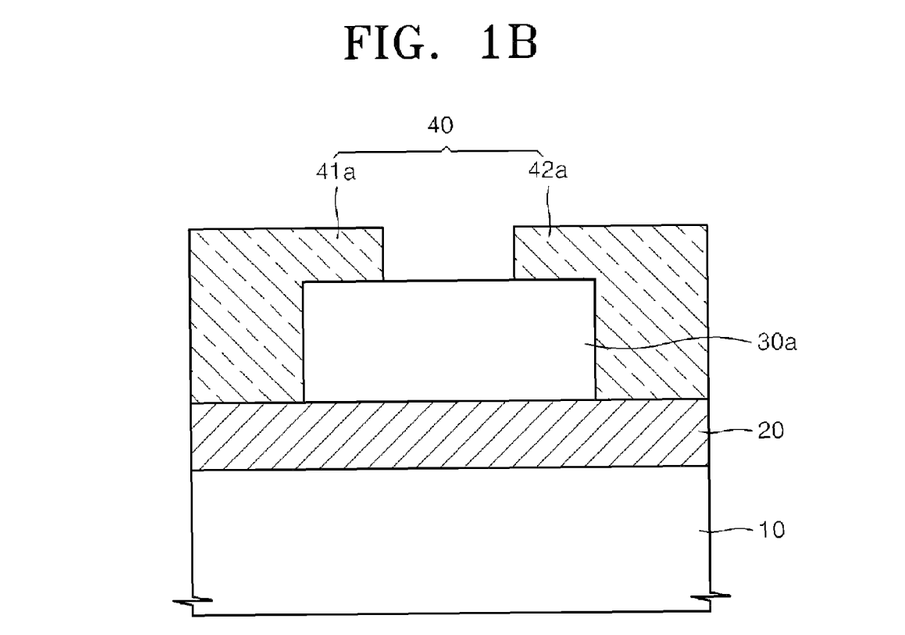
FIG. 1B is a cross-sectional view of an MIT element having a planar structure.

FIG. 1B is a cross-section view of an MIT element having the planar structure. Referring to FIG. 1B, the MIT element having the planar structure includes a substrate 10, a buffer layer 20 formed on the substrate 10, a transition thin film 30a formed on a predetemilned portion of the buffer layer 20, and first and second electrode thin films 41a and 42a formed on the buffer layer 20 and at both sides of the transition thin film 30a. The first and second electrode thin films 41a and 42a are separated frim each other by having the transition thin film 30a placed between them.

Figure 1C:
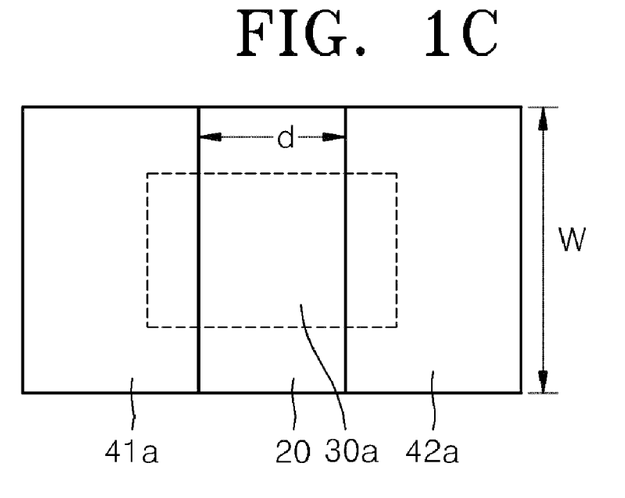
FIG. 1C is a plan view of the MIT element illustrated in FIG. 1B.

FIG. 1C is a plan view of the planar MIT element illustrated in FIG. 1B. Referring to FIG. 1C, the buffer layer 20, the transition thin film 30a, and the first and second electrode thin films 41a and 42a are illustrated.

The aforementioned vertical type or planar type MIT element can be manufactured to a small size in micrometers and at a low cost. When the structure of the MIT element is changed, for example, when the distance (d) between the electrode thin films or the width (w) of the electrode thin films illustrated in FIG. 1C is changed, the transition voltage or the transition temperature can be varied. Furthermore, a variation in an external factor, for example, light, temperature, pressure or gas concentration, can vary the transition voltage or the transition temperature. Accordingly, the external factor variation can be sensed by measuring a transition voltage variation or a transition temperature variation, that is, a discontinuous MIT variation. A circuit for measuring a discontinuous MIT jump will now be explained.

Figure 2:
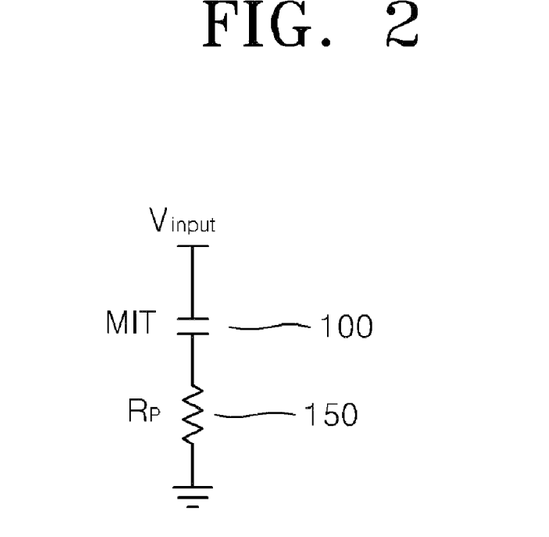
FIG. 2 is an equivalent circuit of an MIT element and a protection resistor.

FIG. 2 is an equivalent circuit of an MIT element 100 and a protection resistor $R_P$ 150. Referring to FIG. 2, the protection resistor $R_P$ 150 protects the MIT element 100. An input voltage $V_{input}$ is directly applied to the MIT element 100. However, the input voltage $V_{input}$ can also be applied to the protection resistor $R_P$ 150. Moreover, a resistance component in the MIT element instead of an external resistor can be used as a protection resistor.

Figure 3A:
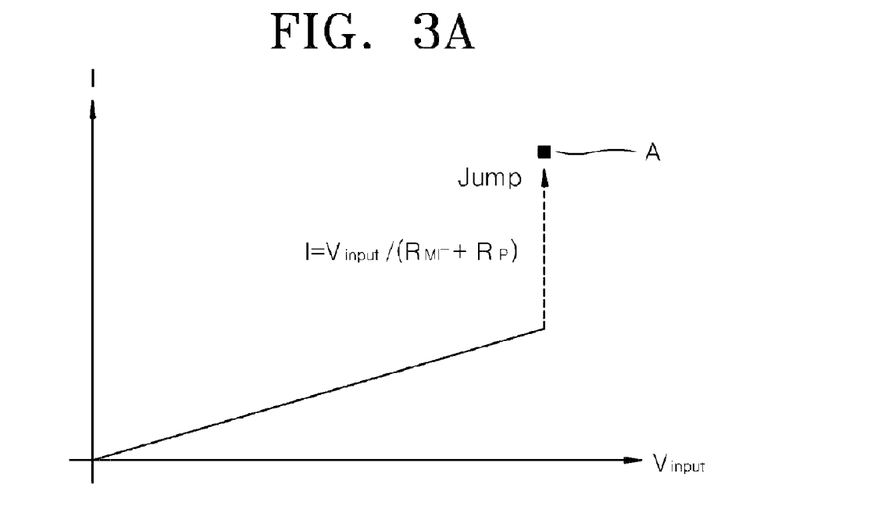
FIG. 3A illustrates a discontinuous jump in a voltage-current curve of the circuit illustrated in FIG. 2.

FIG. 3A illustrates a discontinuous jump in the voltage-current (V-I) curve of the circuit illustrated in FIG. 2. The graph illustrated in FIG. 3A is obtained by measuring the current while increasing the input voltage $V_{input}$ applied to the circuit illustrated in FIG. 2.

Referring to FIG. 3A, the MIT element 100 has the property of insulator at a voltage lower than the transition voltage, and thus current linearly increases according to Ohm's law when the input voltage $V_{input}$ is lower than the transition voltage. When the input voltage $V_{input}$ is equal to or higher than the transition voltage however, the MIT element 100 has the property of metal so that its resistance is considerably reduced and a discontinuous jump A of current occurs. While the discontinuous MIT jump is actually generated in the MIT element 100 only when the input voltage $V_{input}$ is slightly higher than the transition voltage because the circuit illustrated in FIG. 2 includes the protection resistor $R_P$ 150, and hereinafter, the MIT element is explained as the discontinuous MIT jump occurring when the input voltage $V_{input}$ becomes equal to the transition voltage on the assumption that the protection resistor $R_P$ 150 has a very small resistance.

Figure 3B:
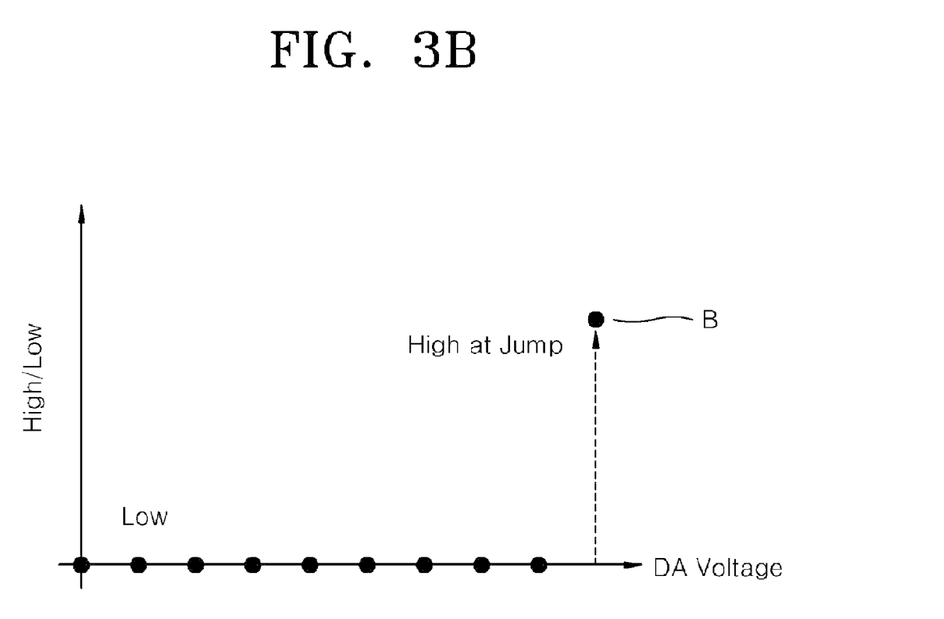
FIG. 3B is a graph obtained by digitizing the voltage-current curve illustrated in FIG. 3A by using simulation.

FIG. 3B is a graph obtained by digitizing the voltage-current curve illustrated in FIG. 3A by using simulation. Referring to FIG. 3B, the input voltage $V_{input}$ has a high value when it is equal to or higher than the transition voltage (DA voltage) at which a discontinuous jump B occurs and has a low value when it is lower than the transition voltage. Digitization using the MIT element can be achieved by measuring the current flowing through the circuit as illustrated in FIG. 2 or a voltage applied to the MIT element, comparing the measured value to a reference current or a reference voltage and allocating a high or low value to the measured value when a certain signal is applied to the circuit. For example, an analog signal input to the circuit illustrated in FIG. 2 can be converted into a digital signal using a comparator. It is possible to connect a plurality of MIT elements having different transition voltages so as to construct a digital circuit.

Figure 4:
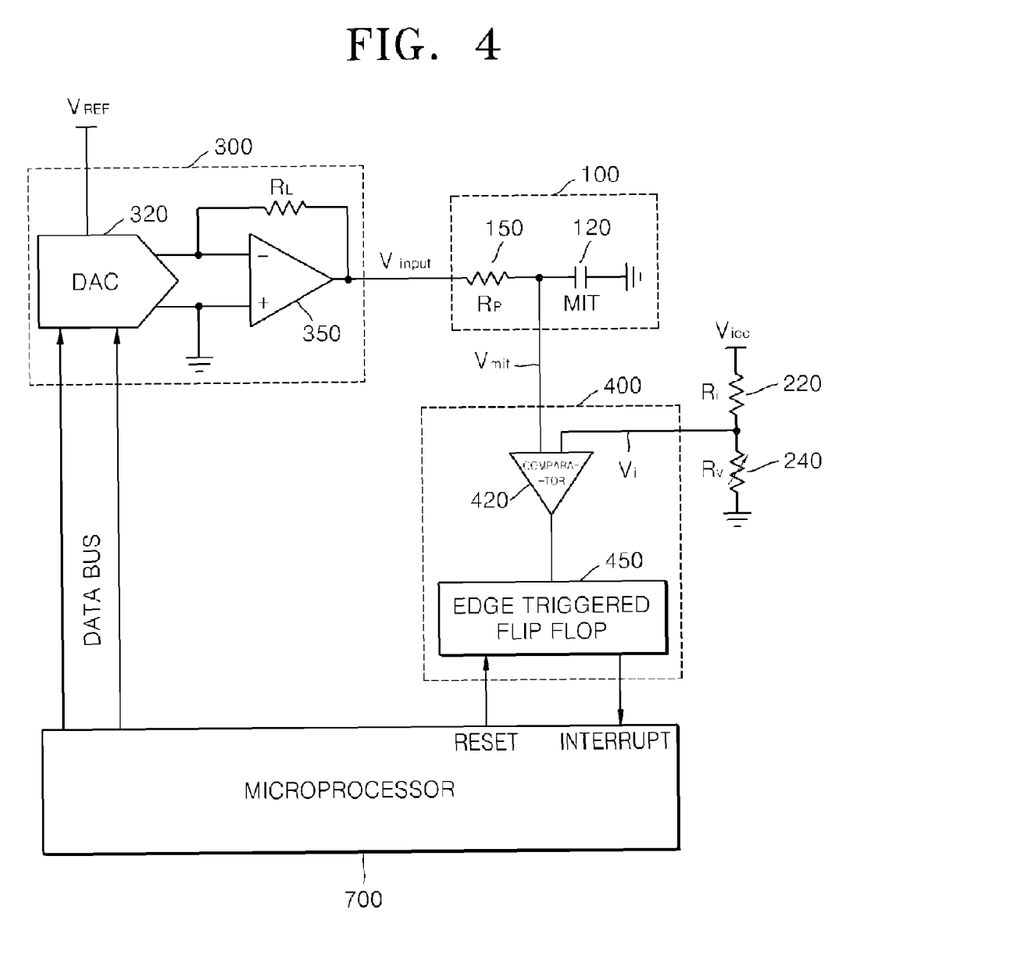
FIG. 4 illustrates a circuit for measuring a discontinuous MIT of an MIT element according to an embodiment of the present invention.

FIG. 4 illustrates a circuit for measuring a discontinuous MIT of an MIT element according to an embodiment of the present invention. Referring to FIG. 4, the discontinuous MIT measurement circuit includes a to-be-measured object unit 100, a power supply unit 300, a measurement unit 400 and a microprocessor 700. The to-be-measured object unit 100 includes an MIT element 120 and a protection resistor $R_P$ 150. The power supply unit 300 includes a digital-to-analog converter (DAC) 320 converting a digital signal to an analog signal and an operational amplifier 350 amplifying the output signal of the DAC 320. A sufficient pulse voltage signal $V_{input}$ is applied to the MIT element 120 through the DAC 320 and the operational amplifier 350.

The measurement unit 400 includes a comparator 420 and an edge triggered flip-flop 450. A voltage $V_{mit}$ applied to the MIT element 120 is input to a first input terminal of the comparator 420 and a reference voltage $V_i$ corresponding to the transition voltage of the MIT element 120 is applied to a second input terminal of the comparator 420. The reference voltage $V_i$ is controlled by connecting two resistors 220 and 240 to a source of a fixed voltage $V_{icc}$. One of the two resistors 220 and 240 is a variable resistor Rv. Accordingly, the reference voltage $V_i$ can be controlled to correspond to the transition voltage of the measured MIT element 120 by adjusting the variable resistor 240.

The comparator 420 outputs a low value when the voltage $V_{mit}$ of the first input terminal is lower than the voltage of the second input terminal, that is, the reference voltage $V_i$, and outputs a high value when the voltage $V_{mit}$ of the first input terminal is equal to or higher than the voltage $V_i$ of the second input terminal. Accordingly, the comparator 420 continuously outputs the low value when the voltage $V_{mit}$ of the first input terminal is lower than the transition voltage and instantaneously outputs the high value when the voltage $V_{mit}$ of the first input terminal is equal to the transition voltage or instantaneously becomes higher than the transition voltage. The comparator 420 outputs a high value only instantaneously because the discontinuous MIT jump instantaneously occurs at the transition voltage or voltages equal to or higher than the transition voltage, and thus the voltage $V_{mit}$ of the first input terminal is immediately dropped to less than the transition voltage.

The edge triggered flip-flop 450 connected to the output terminal of the comparator 420 temporarily stores the instantaneous high value output from the comparator 420 and transmits the stored signal to the microprocessor 700. A sample holder can replace the edge triggered flip-flop 450.

In the case where the reference voltage $V_i$ is set to a voltage after a discontinuous MIT or to a voltage slightly higher than the voltage after the discontinuous MIT, the voltage of the first input terminal of the comparator 420 is equal to or higher than the reference voltage $V_i$ all the time before the discontinuous MIT occurs, and the comparator 420 outputs a low value when the voltage $V_{mit}$ of the first input terminal is equal to or higher than the reference voltage $V_i$ and outputs a high value when the voltage $V_{mit}$ of the first input terminal is lower than or equal to the reference voltage $V_i$. The comparator 420 continuously outputs the low value before the discontinuous MIT because the voltage $V_{mit}$ of the first input terminal is equal to or higher than the reference voltage $V_i$ and, when the voltage $V_{mit}$ of the first input terminal becomes equal to or higher than the transition voltage to induce the discontinuous MIT, the comparator 420 outputs the high value because the voltage $V_{mit}$ of the first input mit terminal becomes equal to or lower than the reference voltage $V_i$.

The microprocessor 700 controls the DAC 320 through a data bus to adjust the voltage or current applied to the to-be-measured object unit 100. In addition, the microprocessor 700 receives the output signal of the edge triggered flip-flop 450, continuously detects whether the discontinuous MIT jump of the MIT element 120 occurs and stores the detection result. While the reference voltage $V_i$ is applied to the second input terminal of the comparator 420 through an additional power supply in the present embodiment, the circuit can be modified so that the microprocessor 700 applies an appropriate reference voltage to the second input terminal of the comparator 420.

Figure 5:
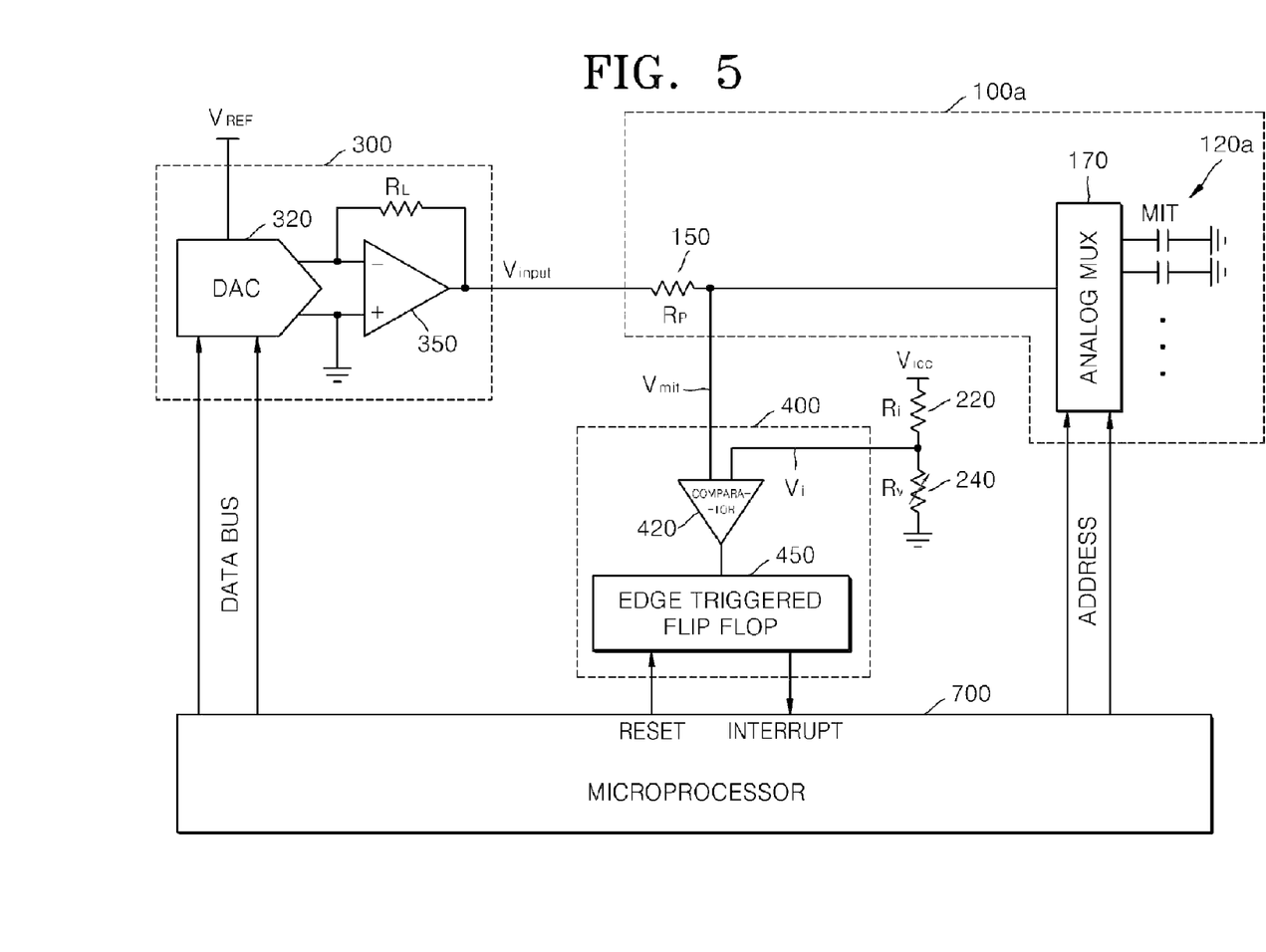
FIG. 5 illustrates a circuit for measuring a discontinuous MIT of multiple MIT elements according to another embodiment of the present invention.

FIG. 5 illustrates a circuit for measuring a discontinuous MIT of a plurality of MIT elements according to another embodiment of the present invention. Referring to FIG. 5, the circuit is identical to the circuit illustrated in FIG. 4 except that a to-be-measured object unit 100a includes a plurality of MIT elements 120a and an analog multiplexer 170 in order to measure the plurality of MIT elements 120a.

The plurality of MIT elements 120a are connected in parallel with the analog multiplexer 170. The analog multiplexer 170 selects MIT elements that are required to be measured from the plurality of MIT elements 120a so that discontinuous MIT jumps of only the selected MIT elements are measured. The analog multiplexer 170 receives a select signal from the microprocessor 700 through a signal line for selecting the MIT elements that are required to be measured.

Figure 6:
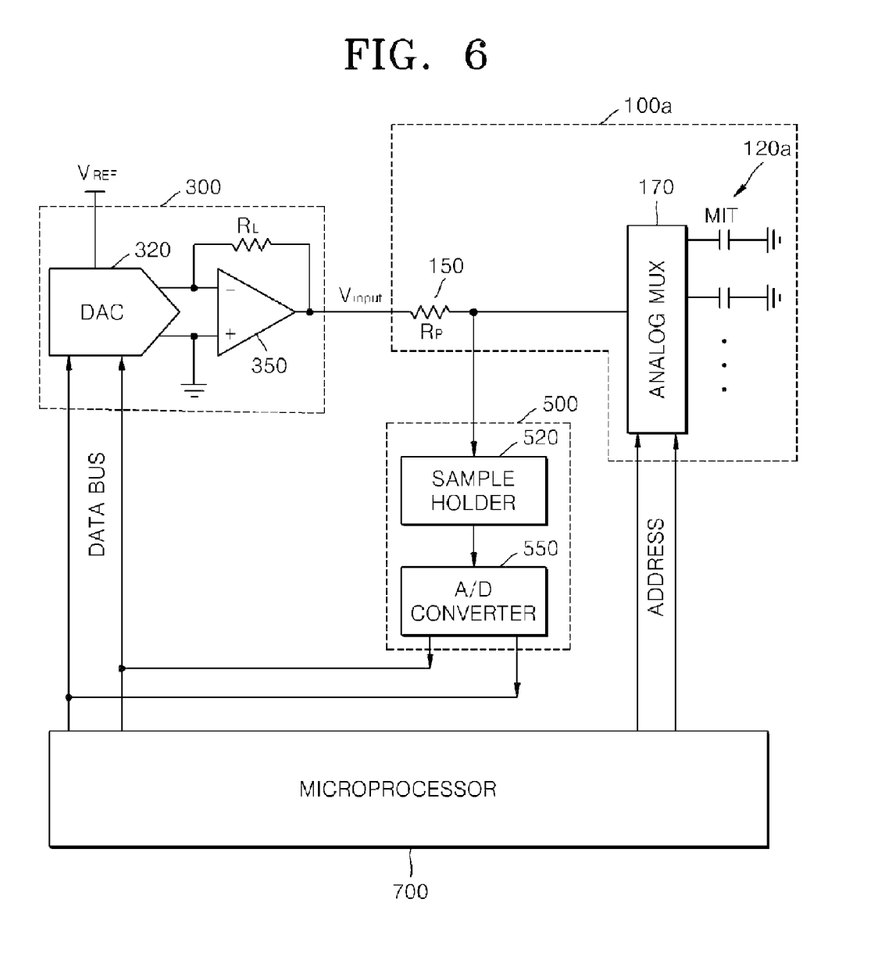
FIG. 6 illustrates a circuit for measuring a discontinuous MIT of multiple MIT elements according to another embodiment of the present invention.

FIG. 6 illustrates a circuit for measuring a discontinuous MIT of a plurality of MIT elements according to another embodiment of the present invention. Referring to FIG. 6, the circuit is identical to the circuit illustrated in FIG. 5 except that the measurement unit 500 uses a sample holder 520 and an analog-to-digital converter (ADC) 550 instead of the comparator 420 and the edge triggered flip-flop 450 illustrated in FIG. 5 in order to correctly measure the discontinuous MIT of the MIT elements 120a according to an analog voltage $V_{input}$ or a current signal input at a high frequency. That is, the measurement unit 400 including the comparator 420 illustrated in FIGS. 4 and 5 cannot correctly measure the discontinuous MIT when the voltage signal $V_{input}$ is input at a high frequency. Accordingly, in the present embodiment, the measurement unit 500 employs the sample holder 520 capable of holding a high-frequency signal for a very short period of time in order to correctly measure the discontinuous MIT of the MIT element 120a using a high-frequency input voltage or current signal.

The signal instantaneously stored in the sample holder 520 is converted into a digital signal by the ADC 550 and transmitted to the microprocessor 700. While the DAC 320 of the power supply unit 300 and the ADC 550 of the measurement unit 500 transmit and receive signals through the same data bus, the signals are distinguished from each other by chip selectors included in the DAC 320 and the ADC 550.

While the circuit illustrated in FIG. 6 includes the multiplexer 170 in order to measure the discontinuous MIT of the plurality of MIT elements 120a, the multiplexer can be omitted when the discontinuous MIT of a single MIT element is measured.

Figure 7:
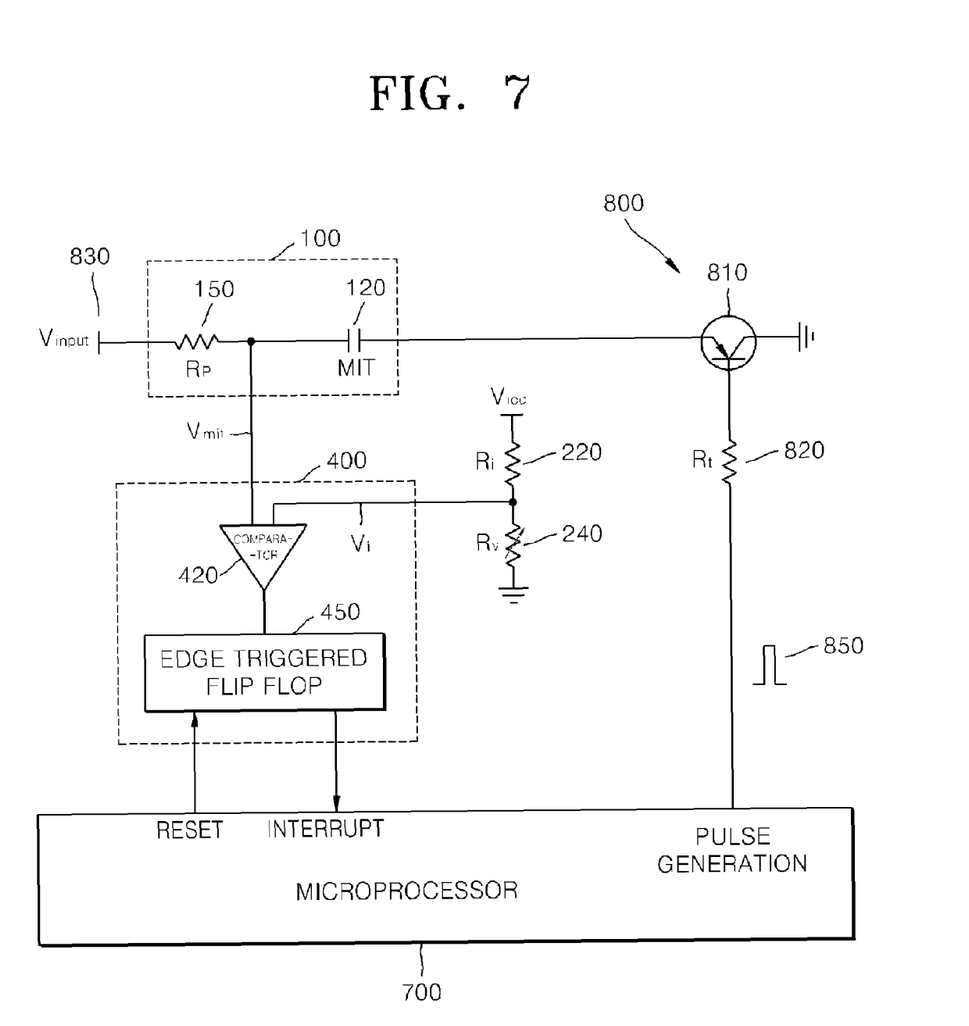
FIG. 7 illustrates a circuit for measuring a discontinuous MIT of an MIT element according to another embodiment of the present invention.

FIG. 7 illustrates a circuit for measuring a discontinuous MIT of an MIT element according to another embodiment of the present invention. Referring to FIG. 7, the circuit is identical to the circuit illustrated in FIG. 4 except that the configuration of a power supply unit 800 is different from that of the circuit illustrated in FIG. 4. That is, the power supply unit 800 includes an input power source 830 supplying a fixed voltage $V_{input}$ and a transistor 810 serving as a current device. The transistor 810 can be a bipolar transistor or a Complementary Metal Oxide Semiconductor (CMOS) transistor. The transistor 810 is turned on or off by a pulse signal applied to a base or a gate thereof.

When the transistor 810 is a bipolar transistor, the to-be measured object unit 100 is connected to the collector or emitter of the bipolar transistor. When the transistor is a MOS transistor, the to-be-measured object unit 100 is connected to the source or drain of the MOS transistor.

FIG. 7 illustrates a PNP bipolar transistor 810 and the to-be-measured object unit 100 is connected to the emitter of the PNP bipolar transistor 810. The base of the PNP bipolar transistor 810 is connected to a transistor resistor $R_r$ 820 and receives a pulse signal 850. The bipolar transistor 810 is a current device and a current corresponding to multiplication of a base current by a current gain flows to the emitter thereof. The pulse signal 850 applied to the base of the bipolar transistor 810 can be generated by the microprocessor 700. Otherwise, the pulse signal can be generated using an additional pulse signal oscillator and applied to the base of the bipolar transistor 810.

The comparator 420 and the edge triggered flip-flop 450 of the measurement unit 400 detect a discontinuous MIT generated in the MIT element 120 in a digital manner, as described in the aforementioned embodiments illustrated in FIGS. 4 and 5. When a plurality of MIT elements are measured in the present embodiment, a multiplexer can be used.

Figure 8:
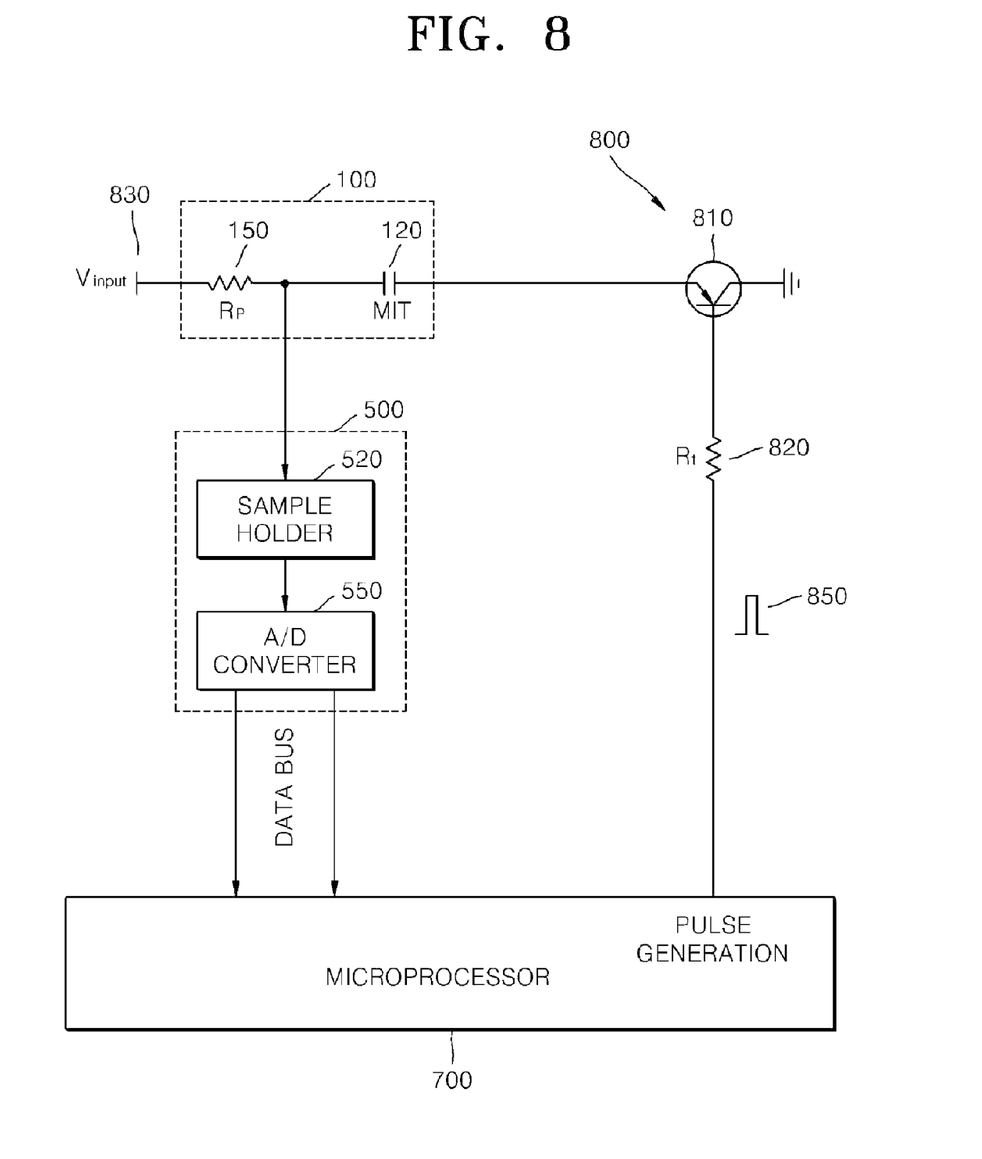
FIG. 8 illustrates a circuit for measuring a discontinuous MIT of an MIT element according to another embodiment of the present invention.

FIG. 8 illustrates a circuit for measuring a discontinuous MIT of an MIT element according to another embodiment of the present invention. Referring to FIG. 8, the circuit is identical to the circuit illustrated in FIG. 7 except that the measurement unit 500 uses a sample holder 520 and an ADC 550 instead of the comparator 420 and the edge triggered flip-flop 450. As described in the aforementioned embodiment illustrated in FIG. 6, the comparator 420 illustrated in FIG. 7 cannot correctly measure a discontinuous MIT when a high-frequency signal is applied to the MIT element 120. Accordingly, the sample holder 520 is used to detect a high-frequency signal and the ADC 550 converts the analog signal output from the sample holder 520 into a digital signal.

In the present embodiment, the pulse signal 850 can be generated using an additional oscillator and a discontinuous MIT of a plurality of MIT elements can be measured using a multiplexer. Experimental data with respect to a discontinuous MIT jump occurring in an MIT element, obtained using the above-described MIT measurement circuits and application fields of the MIT measurement circuits will now be explained.

Figure 9:
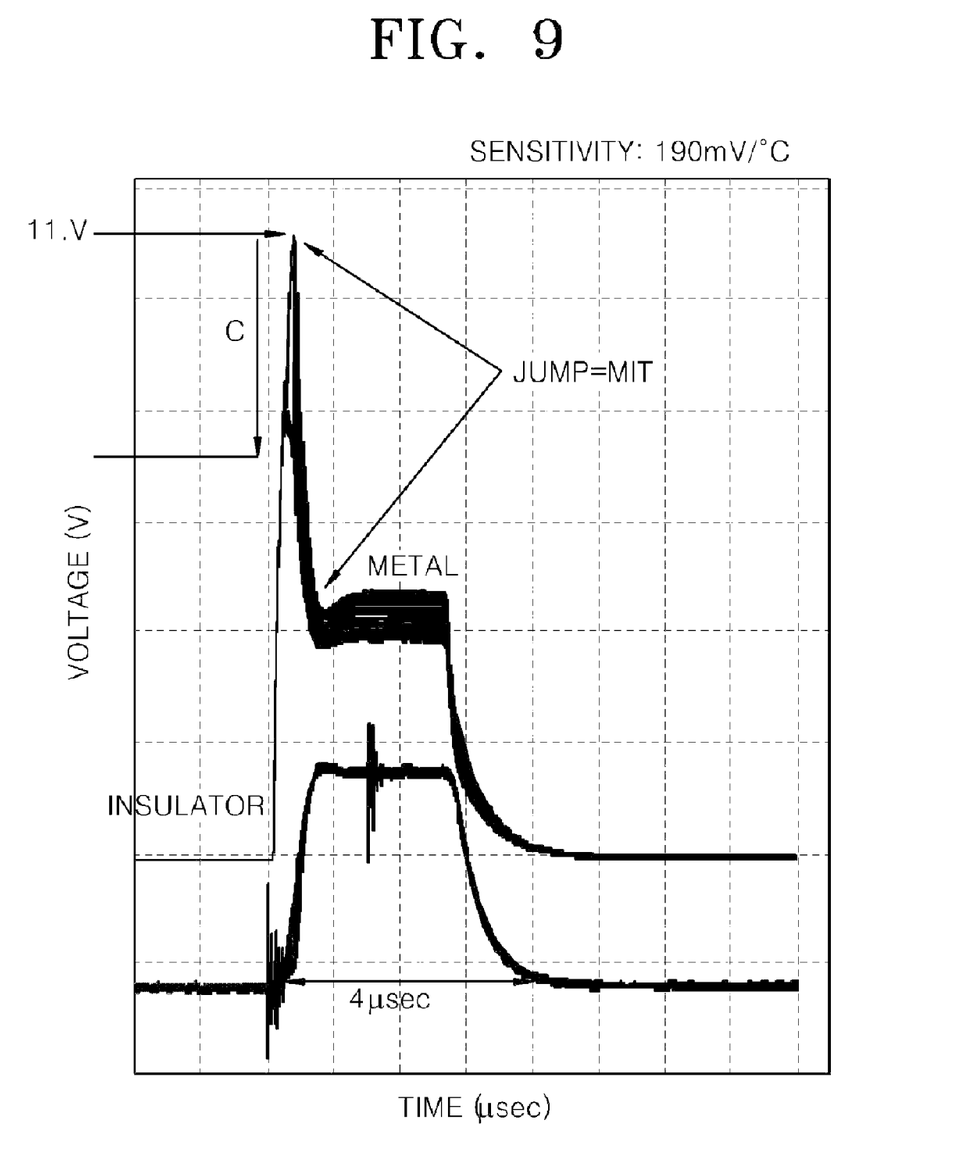
FIG. 9 is a graph illustrating a discontinuous MIT jump of an MIT element, which is measured by the circuit illustrated in FIG. 8.

FIG. 9 is a graph illustrating a discontinuous MIT jump of an MIT element, which is measured by the circuit illustrated in FIG. 8. Referring to FIGS. 8 and 9, when the pulse signal 850 is applied to the base of the transistor 810 of the discontinuous MIT measurement circuit illustrated in FIG. 8, a current flows to the emitter of the transistor 810. Since the emitter current varies in proportion to the base current, as described above, the current flowing through the MIT element 120 in an insulator state abruptly increases, and thus the voltage at the MIT element 120 also sharply increase according to Ohm's law. When the voltage is equal to or higher than the transition voltage of the MIT element 120, a discontinuous MIT occurs in the MIT element 120 and the voltage of the MIT element 120 is abruptly reduced.

In the graph illustrated in FIG. 9, a voltage drop is caused by the discontinuous MIT jump. The transition voltage of the MIT element 120 decreases by approximately 4V from approximately 11V due to a temperature variation of the MIT element 120. According to actual experimental data, the temperature increased by approximately 21° C. and a voltage variation C of approximately 4V occurred due to this temperature variation.

After the transition of the MIT element from an insulator to a metal, the voltage of the MIT element varies according to Ohm's law and then returns to the insulator state, as illustrated in FIG. 9.

The graph illustrated in FIG. 9 was obtained when the pulse signal having a cycle of 4 m sec was applied. The graph shows that the discontinuous MIT jump caused by a high-frequency signal such as the pulse signal having a short cycle can be correctly measured by using the sample holder 520 illustrated in FIG. 8.

The characteristic of the MIT element, whereby the transition voltage varies with temperature, can be used as a temperature sensor. That is, a discontinuous MIT can be continuously measured using the discontinuous MIT measurement circuit to sense an external temperature variation, and thus the MIT measurement circuit can be used as a temperature sensor.

Figure 10:
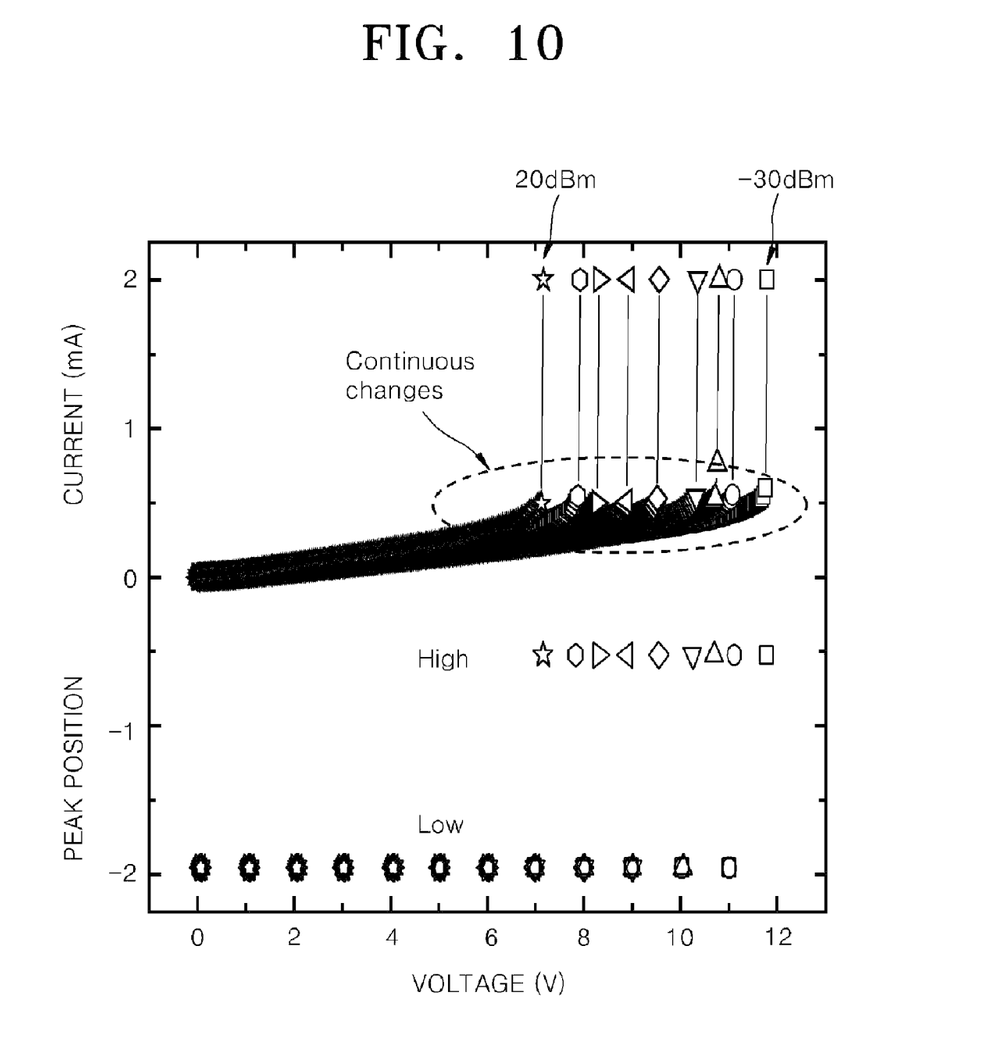
FIG. 10 is a graph illustrating a discontinuous MIT jump that continuously varies with light intensity when light is irradiated onto an MIT element.

FIG. 10 is a graph illustrating a discontinuous MIT jump continuously varying with light intensity when light is irradiated onto an MIT element. In FIG. 10, a voltage-current curve is illustrated at the upper part and the result obtained by digitizing the voltage-current curve is illustrated at the lower part.

Referring to FIG. 10, the voltage-current curve shows a variation in the transition voltage at which a discontinuous MIT jump occurs according to the intensity of light irradiated onto the MIT element. The wavelength of the light is 1.55 m m and the intensity of the light is in the range of −30 dBm to 20 Bm. As illustrated in FIG. 10, the transition voltage decreases as the light intensity increases. Accordingly, it is possible to construct an electromagnetic wave measurement sensor in such a manner that the transition voltage of the MIT element, which varies with light, that is, electromagnetic waves, is continuously measured using the above-described MIT measurement circuits. Furthermore, it is possible to construct an image sensor used in a digital camera in such a manner that a large number of MIT elements are arranged in an array or matrix and discontinuous MITs of the MIT elements are measured using the aforementioned MIT measurement circuits.

The graph illustrated at the lower part in FIG. 10 shows that various binary values can be produced because the voltage at which a discontinuous MIT jump occurs varies with the intensity of electromagnetic waves. For example, when an electromagnetic wave of −30 dBm is irradiated onto the MIT element, a discontinuous MIT occurs at approximately 12V. Thus, a high value is output at voltages equal to or higher than 12V and a low value is output at voltages lower than 12V. When an electromagnetic wave of 20 dBm is irradiated onto the MIT element, a discontinuous MIT occurs at approximately 7V, and thus a low value is output at voltages lower than 7V and a high value is output at voltages equal to or higher than 7V.

Figure 11A:
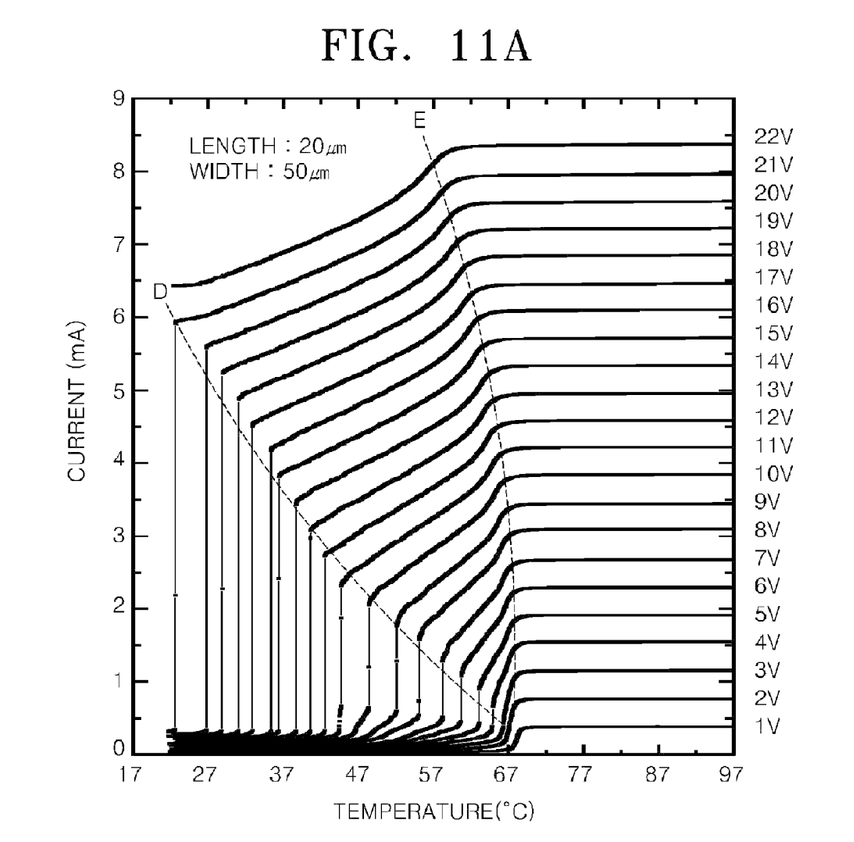
FIGS. 11A and 11B are graphs illustrating a discontinuous MIT jump that continuously varies with temperature sensed from an MIT element when heat is applied to the MIT element.
Figure 11B:
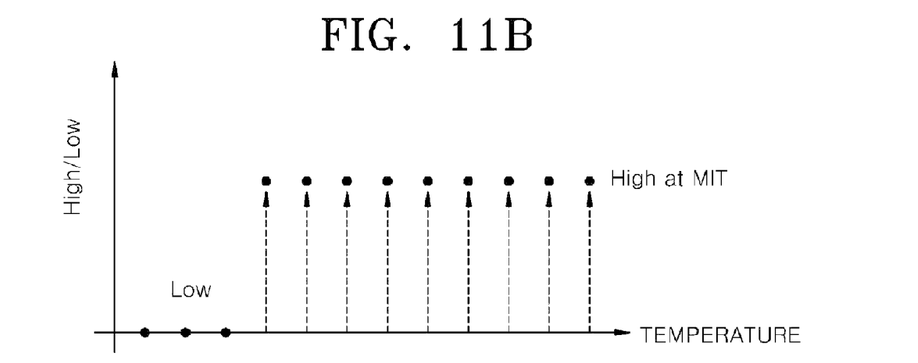

FIGS. 11A and 11B are graphs illustrating a discontinuous MIT jump continuously varying with temperature sensed from an MIT element when heat is applied to the MIT element. The MIT element has the planar structure as illustrated in FIG. 1B. The transition thin film of the MIT element is formed of $VO_2$, a distance between electrodes is 20 m m, the width of the electrodes is 50 m m, and the transition voltage is approximately 21.5V.

Referring to FIG. 11A the transition temperature of the MIT element decreases as the voltage increases. As the voltage applied to the MIT element becomes close to the transition voltage of the MIT element, that is, 21.5V, the transition temperature approaches the normal temperature. When 22V is applied to the MIT element, the voltage conforms to Ohm's law and the transition temperature does not manifest. That is, when a voltage equal to or higher than the transition voltage is applied, a discontinuous MIT caused by the voltage occurs and a discontinuous MIT caused by temperature does not occur. In FIG. 11A, D represents a discontinuous MIT jump line and E represents a structure phase transition line.

As described above, a discontinuous MIT according to the temperature of the MIT element can be measured and a voltage variation according to the temperature can be measured. Accordingly, the temperature of the MIT element can be measured by measuring the discontinuous MIT using the aforementioned discontinuous MIT measurement circuits, and thus a temperature sensor can be constructed using the discontinuous MIT measurement circuits.

FIG. 11B is a graph obtained by digitizing the transition temperature variation illustrated in FIG. 11A. Referring to FIG. 11B, a low value is output at temperatures lower than a specific transition temperature and a high value is output at temperatures equal to or higher than the transition temperature. While the temperature should be represented by various shapes as illustrated in the lower part of FIG. 10, it is represented by only dots in order to simplify the graph.

The transition voltage or the transition temperature of the MIT element varies with an external factor such as light, temperature, pressure or gas concentration, and thus a variation in the external factor can be sensed by measuring the transition voltage or the transition temperature. In order to measure a variation in the transition temperature, a circuit capable of continuously measuring a discontinuous MIT jump of the MIT element is required. The above-described discontinuous MIT measurement circuits can be used to measure the transition temperature variation.

Accordingly, a sensor capable of sensing the transition voltage or the transition temperature which varies with light, temperature, pressure or gas concentration can be easily formed using the discontinuous MIT measurement circuits according to the present invention. Furthermore, an image sensor used in a digital camera can be constructed in such a manner that a plurality of MIT elements are arranged in an array or matrix and light intensity is sensed through the aforementioned MIT measurement circuits.

While the present invention has been particularly shown and described with reference to exemplary embodiments thereof, it will be understood by those of ordinary skill in the art that various changes in form and details may be made therein without departing from the spirit and scope of the present invention as defined by the following claims.

INDUSTRIAL APPLICABILITY

The present invention relates to a metal-insulator transition (MIT) device, and more particularly, to an MIT element application circuit and an MIT sensor using the same. The discontinuous MIT measurement circuit according to the present invention can continuously measure a discontinuous MIT of an MIT element. Furthermore, since the transition voltage or the transition temperature of the MIT element varies with an external factor such as temperature, pressure or gas concentration, the discontinuous MIT measurement circuit can be used as a sensor for sensing a variation in the external factor by continuously measuring the discontinuous MIT of the MIT element. Moreover, a plurality of MIT elements are arranged in an array or matrix and light intensity is sensed through the MIT measurement circuit to construct an image sensor used in a digital camera.

The invention claimed is:

1. A circuit for measuring a discontinuous MIT (metal-insulator transition) of an MIT element comprising:
    a to-be-measured object unit including the MIT element in which a discontinuous MIT occurs at the transition voltage thereof;
    a power supply unit applying a predetermined pulse current or voltage signal to the to-be-measured object unit;
    a measurement unit measuring the discontinuous MIT of the MIT element; and
    a controller controlling the power supply unit and the measurement unit,
    wherein the to-be-measured object unit comprises a protection resistor connected in series with the MIT element, the power supply unit comprises a transistor controlled by a pulse current or voltage signal and an input power supply applying a fixed voltage to the to-be-measured object unit, and the measurement unit comprises a sample holder and an ADC converting the output signal of the sample holder into a digital signal.

2. The circuit of claim 1, wherein the measurement unit comprises a microprocessor.

3. The circuit of claim 1, wherein the power supply unit comprises a DAC (digital-to-analog converter) generating the pulse current or voltage signal and an operational amplifier amplifying the output signal of the DAC, and the measurement unit comprises a comparator and an edge triggered flip-flop.

4. The circuit of claim 3, wherein a first input terminal of the comparator is connected between the MIT element and the protection resistor and a second input terminal thereof receives a reference voltage corresponding to the transition voltage of the MIT element, the reference voltage is controlled through a variable resistor, and the pulse current or voltage signal generated by the power supply unit is applied to the MIT element.

5. The circuit of claim 4, wherein the comparator outputs a Low signal when the voltage of the first input terminal is lower than the voltage of the second input terminal and outputs a High signal when the voltage of the first input terminal is equal to or higher than the voltage of the second input terminal, and the edge triggered flip-flop or the sample holder stores the output signal of the comparator and transmits the output signal to the microprocessor of the controller.

6. The circuit of claim 1, wherein the predetermined pulse current or voltage signal is applied by a microprocessor of the controller.

7. The circuit of claim 1, wherein the power supply unit comprises a DAC generating the pulse current or voltage signal and an operational amplifier amplifying the output signal of the DAC.

8. The circuit of claim 7, wherein the pulse current or voltage signal is applied to the MIT element at a high frequency, the sample holder stores a variation in the voltage or current of the MIT element for a predetermined period of time, and the ADC receives the output signal of the sample holder, converts the output signal into a digital signal and transmits the digital signal to a microprocessor of the controller.

9. The circuit of claim 7, wherein a microprocessor of the controller outputs a control signal to the DAC and receives the signal corresponding to the voltage or current variation of the MIT element from the ADC through a data bus, and signal transmission through the data bus is controlled by a chip selector.

10. The circuit of claim 1, wherein the power supply unit comprises a transistor controlled by a pulse current or voltage signal and an input power supply applying a fixed voltage to the to-be-measured object unit, and the measurement unit comprises a comparator and an edge triggered flip-flop.

11. The circuit of claim 10, wherein a first input terminal of the comparator is connected between the MIT element and the protection resistor and a second input terminal thereof receives a reference voltage corresponding to the transition voltage of the MIT element, the reference voltage is controlled by a variable resistor, the comparator outputs a Low signal when the voltage of the first input terminal is lower than the voltage of the second input terminal and outputs a High signal when the voltage of the first input terminal is equal to or higher than the voltage of the second input terminal, and the edge triggered flip-flop or the sample holder stores the output signal of the comparator and transmits the output signal to a microprocessor of the controller.

12. The circuit of claim 10, wherein the pulse current or voltage signal is generated by the microprocessor and applied to the transistor or is generated by an additional pulse generating oscillator and applied to the transistor.

13. The circuit of claim 10, wherein the transistor is a bipolar transistor or a MOS (Metal Oxide Semiconductor) transistor.

14. The circuit of claim 13, wherein the transistor is a bipolar transistor, the pulse current or voltage signal is applied to a base of the bipolar transistor, and the to-be-measured object unit is connected to a collector or emitter of the bipolar transistor.

15. The circuit of claim 13, wherein the transistor is a MOS transistor, the pulse current or voltage signal is applied to a gate of the MOS transistor, and the to-be-measured object unit is connected to a drain or source of the MOS transistor.

16. The circuit of claim 1, wherein a high-frequency pulse voltage or current signal is applied to the MIT element, the sample holder stores a variation in the voltage or current of the MIT element for a predetermined period of time, and the ADC receives the output signal of the sample holder, converts the output signal into a digital signal and transmits the digital signal to a microprocessor of the controller.

17. The circuit of claim 1, wherein the to-be-measured object unit comprises at least two MIT elements and a multiplexer selecting the MIT elements, and the microprocessor applies a select signal to the multiplexer to select at least one of the MIT elements so as to measure a discontinuous MIT of the at least one selected MIT element.

18. The circuit of claim 1, wherein the to-be-measured object unit comprises at least two MIT elements and a multiplexer selecting the MIT elements, and the microprocessor applies a select signal to the multiplexer to select at least one of the MIT elements so as to measure a discontinuous MIT of the at least one selected MIT element.

19. The circuit of claim 1, wherein a resistance component in the MIT element can be used instead of an external resistor as a protection resistor.

20. An MIT sensor including the circuit of claim 1.

21. The MIT sensor of claim 20, wherein the MIT sensor corresponds to one of a temperature sensor, an infrared ray sensor, an image sensor, a pressure sensor, an electromagnetic sensor, a particle detector, a gas concentration sensor and a switch.

22. The MIT sensor of claim 20, wherein the to-be-measured object unit comprises a plurality of MIT elements that are connected in series, parallel or series and parallel, or arranged in an array or matrix.

23. The MIT sensor of claim 22, wherein the MIT elements are arranged in an array or matrix and have a transition voltage varying according to electromagnetic waves including infrared rays, and the discontinuous MIT measurement unit detects the transition voltage so as to measure the intensity of the electromagnetic waves.

24. The MIT sensor of claim 23, wherein the MIT sensor is an image sensor.

\* \* \* \* \*